(12) United States Patent
Rozenblit et al.

(10) Patent No.: US 7,082,169 B2
(45) Date of Patent: Jul. 25, 2006

(54) MIRROR TRANSLATION LOOP TRANSMITTER ARCHITECTURE

(75) Inventors: Dmitriy Rozenblit, Irvine, CA (US); William J. Domino, Yorba Linda, CA (US); Morten Damgaard, Laguna Hills, CA (US)

(73) Assignee: Skyworks Solutions, Inc., Irvine, CA (US)

( * ) Notice: Subject to any disclaimer, the term of this patent is extended or adjusted under 35 U.S.C. 154(b) by 749 days.

(21) Appl. No.: 10/207,320

(22) Filed: Jul. 29, 2002

(65) Prior Publication Data

US 2004/0017858 A1    Jan. 29, 2004

(51) Int. Cl.
*H03K 7/06* (2006.01)
(52) U.S. Cl. .................... 375/271; 375/302
(58) Field of Classification Search ........ 375/271–283, 375/295–308, 261, 285; 332/100–105
See application file for complete search history.

(56) References Cited

U.S. PATENT DOCUMENTS

| | | | |
|---|---|---|---|
| 5,410,280 A * | 4/1995 | Linguet et al. | 332/149 |
| 5,694,093 A | 12/1997 | DaSilva et al. | 332/103 |
| 6,285,251 B1 | 9/2001 | Dent et al. | 330/127 |
| 6,449,465 B1 * | 9/2002 | Gailus et al. | 455/126 |
| 6,738,432 B1 * | 5/2004 | Pehlke et al. | 375/300 |

* cited by examiner

*Primary Examiner*—Don N. Vo

(57) ABSTRACT

A mirror translation loop upconverter that is capable of upconverting both constant envelope and non-constant envelope modulation formats is disclosed. Embodiments of the invention provide the ability to upconvert a transmit signal that includes only a phase-modulated component, only an amplitude-modulated component, or both a phase-modulated component and an amplitude-modulated component. If the transmit signal includes both a phase-modulated signal component and an amplitude-modulated signal component, the phase-modulated signal component and the amplitude-modulated signal component are supplied to a pair of phase shifters. The phase shifters alter the phase of the phase-modulated signal by an amount related to the amplitude of the amplitude-modulated signal. The phase shifters oppositely alter the phase of the phase-modulated signal, and therefore supply complementary phase versions of the phase-modulated signal. The phase-altered phase-modulated signals from the phase shifters are then supplied to a pair of translation loops. The translation loops are arranged in mirror architecture so that each translation loop receives the phase-altered phase-modulated signals. Each translation loop upconverts the signals and supplies a vector. The vectors supplied by the two translation loops are constant in magnitude, and have complementary phase. The two vectors are added together to provide a signal to a power amplifier. The signal represents both the phase and amplitude information to be transmitted.

25 Claims, 5 Drawing Sheets

MIRROR TRANSLATION LOOP TRANSMITTER ARCHITECTURE

BACKGROUND OF THE INVENTION

1. Field of the Invention

This invention relates generally to maximizing radio frequency transmission power and providing a universal transmitter architecture in a wireless communication device transmitter. More particularly, the invention relates to a mirror translation loop transmitter architecture operable with both constant and non-constant radio frequency (RF) envelope modulation methodologies.

2. Related Art

With the increasing availability of efficient, low cost electronic modules, mobile communication systems are becoming more and more widespread. For example, there are many variations of communication schemes in which various frequencies, transmission schemes, modulation techniques and communication protocols are used to provide two-way voice and data communications in a handheld, telephone-like communication handset. The different modulation and transmission schemes each have advantages and disadvantages.

As these mobile communication systems have been developed and deployed, many different standards have evolved to which these systems must conform. For example, in the United States, third generation portable communications systems comply with the IS-136 standard, which requires the use of a particular modulation scheme and access format. In the case of IS-136, the modulation scheme can be 8-quadrature phase shift keying (8QPSK), offset $\pi/4$ differential quadrature phase shift keying ($\pi/4$-DQPSK) or variations thereof and the access format is TDMA.

Other standards may require the use of, for example, code division multiple access (CDMA). Further, new standards such as enhanced data rates for GSM evolution (EDGE), which is an extension to the global system for mobile communications (GSM to be described below) standard, and wide band code division multiple access (WCDMA) are continually emerging. One aspect that all these systems have in common is that they all use a signal having a time varying amplitude. This is sometimes referred to as a "non-constant envelope modulation."

In Europe, the global system for mobile communications (GSM) standard requires the use of the Gaussian minimum shift keying (GMSK) modulation scheme in a narrow band TDMA access environment, which uses a constant envelope modulation methodology.

Furthermore, in a typical GSM mobile communication system using narrow band TDMA technology, a GMSK modulation scheme supplies a very low noise phase-modulated (PM) transmit signal to a non-linear power amplifier directly from an oscillator. In such an arrangement, a highly efficient non-linear power amplifier can be used thus allowing efficient modulation of the phase-modulated signal and minimizing power consumption. Because the modulated signal is typically supplied directly from an oscillator, the need for filtering, either before or after the power amplifier, is minimized.

Many non-constant envelope transmit architectures use a modulation scheme where both a PM signal and an amplitude-modulated (AM) signal are transmitted.

Standards employing these schemes increase the data rate without increasing the bandwidth of the transmitted signal. Unfortunately, even though it would be desirable to have one portable transceiver that can accommodate all of the above-mentioned transmission schemes, existing GSM modulation schemes are not easily adapted to transmit a signal that includes both a PM component and an AM component.

In the non-constant envelope modulation schemes typically used in mobile communications, the transmit output signal varies in both phase and amplitude. In constant envelope modulation, the transmit output signal is always at a constant amplitude. Emerging communication standards, such as EDGE and WCDMA will likely use a non-constant envelope modulation scheme. As the transmit architectures for these new standards are under development, it is generally desirable to have a single transmit architecture that supports as many standards as possible.

One possible manner of developing a single transmit architecture that is capable of both constant envelope and non-constant envelope modulation uses a conventional upconverter with filters inserted into the transmit chain. Such an architecture requires filters at the intermediate frequency (IF), at the radio frequency (RF) before the power amplifier, and at RF after the power amplifier. Unfortunately, a multi-standard transmit architecture would require many filters to be switched in and out of the transmit circuit, or would require separate transmit chains.

Further, when attempting to include a PM component and an AM component in a GSM type modulation system, the power amplifier's non-linearity could negatively affect the quality of the transmitted signal and introduce unrecoverable errors. Also, the transmitter's non-linearity could cause intermodulation products and cause regrowth of the transmit spectrum, thereby causing an unacceptable adjacent channel power ratio. Furthermore, while attempting to include a PM component and an AM component in a GSM type modulation system, the power control loop will tend to reject the amplitude variations present in the signal while attempting to maintain the desired output power. In such an arrangement, the power control loop tends to cancel the AM portion of the signal within its power control loop bandwidth.

Further still, in those transmission standards in which both a PM signal and an AM signal are sent to a power amplifier, unless the power amplifier is very linear, it may distort the combined transmission signal by causing undesirable AM to PM conversion. This conversion is detrimental to the transmit signal and can require the use of a costly and inefficient linear power amplifier.

With the increasing desirability of developing one worldwide portable communication standard, it would be desirable to allow a single portable transceiver to transmit a signal having either a constant or a non-constant envelope signal, while maximizing the efficiency of the power amplifier.

SUMMARY

Embodiments of the invention include a mirror translation loop transmitter architecture that is capable of upconverting both constant envelope and non-constant envelope modulation formats.

Embodiments of the invention maximize the efficiency of a power amplifier and provide the ability to upconvert a transmit signal that includes only a phase-modulated component, only an amplitude-modulated component, or both a phase-modulated component and an amplitude-modulated component. If the transmit signal includes both a phase-modulated signal component and an amplitude-modulated signal component, the phase-modulated signal component and the amplitude-modulated signal component are supplied to a pair of phase shifters. The phase shifters alter the phase of the phase-modulated signal component by an amount related to the magnitude of the amplitude modulation. The phase shifters each alter the phase of the phase-modulated signal component by an equal amount, but with opposite sign, and therefore supply complementary phase versions of the phase-modulated signal component. The phase-altered phase-modulated signals from the phase shifters are then supplied to a pair of translation loops. The translation loops are arranged in a mirror architecture so that each translation loop receives the phase-altered phase-modulated signals. Each translation loop upconverts the signals and supplies a vector. The vectors supplied by the two translation loops are constant in magnitude, but have complementary phase. The two vectors are added together to provide a signal to a power amplifier. The signal represents both the phase and amplitude information to be transmitted.

If the transmit signal includes only a phase-modulated component, then the signal is passed directly through the phase shifters to the mirror translation loops. The mirror translation loops upconvert the signal and each provide a vector at the same phase. The two vectors are summed together to provide a signal to a power amplifier. Because the vectors have equal phase, the signal represents only the phase information to be transmitted.

If the transmit signal includes only an amplitude-modulated-component, then the phase-modulated signal component is replaced by a continuous wave (CW) signal. The amplitude modulation is applied to the phase shifters as described above. The mirror translation loops upconvert the signal and each provide a vector. The two vectors are, summed together to provide a signal to a power amplifier. The phases of the two vectors are such that the phase of their vector sum is constant, but the amplitude of their vector sum represents the desired amplitude modulation.

Related methods of operation and computer readable media are also provided. Other systems, methods, features, and advantages of the invention will be or become apparent to one with skill in the art upon examination of the following figures and detailed description. It is intended that all such additional systems, methods, features, and advantages be included within this description, be within the scope of the invention, and be protected by the accompanying claims.

BRIEF DESCRIPTION OF THE FIGURES

The invention can be better understood with reference to the following figures. The components within the figures are not necessarily to scale, emphasis instead being placed upon clearly illustrating the principles of the invention. Moreover, in the figures, like reference numerals designate corresponding parts throughout the different views.

DETAILED DESCRIPTION

Figure 1:
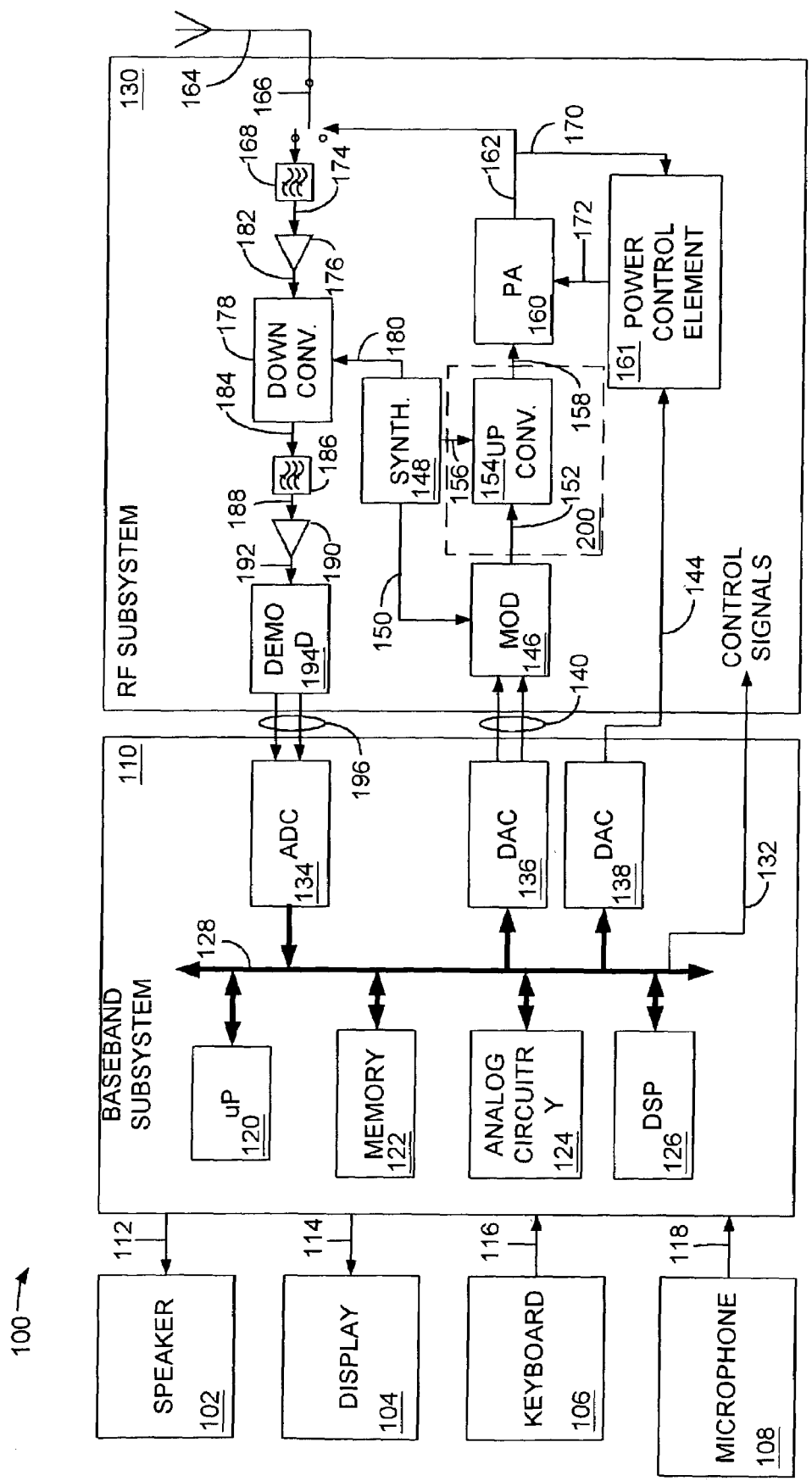
FIG. 1 is a block diagram illustrating a simplified portable transceiver.

Although described with particular reference to a portable transceiver, the mirror translation loop transmitter architecture can be implemented in any system where a signal containing only a PM component, a combined signal including a PM component and an AM component, or a signal containing only an AM component is supplied to a power amplifier. Furthermore, the mirror translation loop transmitter architecture is applicable to any transmitter in which a PM signal and an AM signal are supplied to a linear power amplifier.

The mirror translation loop transmitter architecture can be implemented in software, hardware, or a combination of software and hardware. Selected portions of the transmitter architecture may be implemented in hardware and software. The hardware portion of the invention can be implemented using specialized hardware elements and logic. The software portion can be stored in a memory and be executed by a suitable instruction execution system (microprocessor). The hardware implementation of the transmitter architecture can include any or a combination of the following technologies, which are all well known in the art: a discrete logic circuit(s) having logic gates for implementing logic functions upon data signals, an application specific integrated circuit having appropriate logic gates, a programmable gate array(s) (PGA), a field programmable gate array (FPGA), etc.

In one embodiment, the software of the mirror translation loop transmitter architecture may comprise an ordered listing of executable instructions for implementing logical functions, and can be embodied in any computer-readable medium for use by or in connection-with an instruction execution system, apparatus, or device, such as a computer-based system, processor-containing system, or other system that can fetch the instructions from the instruction execution system, apparatus, or device and execute the instructions.

In the context of this document, a "computer-readable medium" can be any means that can contain, store, communicate, propagate, or transport the program for use by or in connection with the instruction execution system, apparatus, or device. The computer readable medium can be, for example but not limited to, an electronic, magnetic, optical, electromagnetic, infrared, or semiconductor system, apparatus, device, or propagation medium. More specific examples (a non-exhaustive list) of the computer-readable medium would include the following: an electrical connection (electronic) having one or more wires, a portable computer diskette (magnetic), a random access memory (RAM), a read-only memory (ROM), an erasable programmable read-only memory (EPROM or Flash memory) (magnetic), an optical fiber (optical), and a portable compact disc read-only memory (CDROM) (optical). Note that the computer-readable medium could even be paper or another suitable medium upon which the program is printed, as the program can be electronically captured, via for instance optical scanning of the paper or other medium, then compiled, interpreted or otherwise processed in a suitable manner if necessary, and then stored in a computer memory.

FIG. 1 is a block diagram illustrating a simplified portable transceiver 100. Portable transceiver 100 includes speaker 102, display 104, keyboard 106, and microphone 108, all connected to baseband subsystem 110. In a particular embodiment, portable transceiver 100 can be, for example but not limited to, a portable telecommunication handset such as a mobile wireless cellular-type telephone. Speaker 102 and display 104 receive signals from baseband subsystem 110 via connections 112 and 114, respectively, as known to those skilled in the art. Similarly, keyboard 106 and microphone 108 supply signals to baseband subsystem 110 via connections 116 and 118, respectively. Baseband subsystem 110 includes microprocessor (µP) 120, memory 122, analog circuitry 124, and digital signal processor (DSP)

126 in communication via bus 128. Bus 128, although shown as a single bus, may be implemented using multiple busses connected as necessary among the subsystems within baseband subsystem 110. Microprocessor 120 and memory 122 provide the signal timing, processing and storage functions for portable transceiver 100. Analog circuitry 124 provides the analog processing functions for the signals within baseband subsystem 110. Baseband subsystem 110 provides control signals to radio frequency (RF) subsystem 130 via connection 132. Although shown as a single connection 132, the control signals may originate from DSP 126 or from microprocessor 120, and are supplied to a variety of points within RF subsystem 130. It should be noted that, for simplicity, only the basic components of portable transceiver 100 are illustrated herein.

Baseband subsystem 110 also includes analog-to-digital converter (ADC) 134 and digital-to-analog converters (DACs) 136 and 138. ADC 134, DAC 136 and DAC 138 also communicate with microprocessor 120, memory 122, analog circuitry 124 and DSP 126 via bus 128. DAC 136 converts the digital communication information within baseband subsystem 110 into an analog signal for transmission to RF subsystem 130 via connection 140. DAC 138 provides a reference voltage power level signal to power control element 161 via connection 144. Connection 140, while shown as two directed arrows, includes the information that is to be transmitted by RF subsystem 130 after conversion from the digital domain to the analog domain.

RF subsystem 130 includes modulator 146, which, after receiving a frequency reference signal, also called a "local oscillator" signal, or "LO," from synthesizer 148 via connection 150, modulates the received analog information and provides a modulated signal via connection 152 to upconverter 154. The modulated transmit signal may include only phase information, only amplitude information, or both phase and amplitude information, depending on the desired transmit format. Upconverter 154 also receives a frequency reference signal from synthesizer 148 via connection 156. Synthesizer 148 determines the appropriate frequency to which upconverter 154 will upconvert the modulated signal on connection 152. As will be described in detail below, the upconverter 154, along with other components to be described below, forms a mirror translation loop architecture that is capable of upconverting a phase-modulated signal, an amplitude-modulated signal, or a signal that is both phase and amplitude-modulated. The mirror translation loop 200 comprises a universal transmit architecture that can be used to upconvert both constant envelope and non-constant envelope modulation formats. Further, as will be described below, the mirror translation loop uses an oscillator to provide a low noise upconverted signal to power amplifier 160.

Upconverter 154 supplies the modulated signal via connection 158 to power amplifier 160. Power amplifier 160 amplifies the modulated signal on connection 158 to the appropriate power level for transmission via connection 162 to antenna 164.

Illustratively, switch 166 controls whether the amplified signal on connection 162 is transferred to antenna 164 or whether a received signal from antenna 164 is supplied to filter 168. The operation of switch 166 is controlled by a control signal from baseband subsystem 110 via connection 132. Alternatively, the switch 166 may be replaced by a filter (e.g., a diplexer) that allows simultaneous passage of both transmit signals and receive signals, as known to those having ordinary skill in the art.

A portion of the amplified transmit signal energy on connection 162 is supplied via connection 170 to power control element 161. Power control element 161 may form a closed power control feedback loop to control the output power of power amplifier 160 and may also supply a power control feedback signal via connection 172.

A signal received by antenna 164 will be directed to receive filter 168. Receive filter 168 will filter the received signal and supply the filtered signal on connection 174 to low noise amplifier (LNA) 176. Receive filter 168 is a band pass filter, which passes all channels of the particular cellular system in which the portable transceiver 100 is operating. As an example, for a 900 MHz GSM system, receive filter 168 would pass all frequencies from 935.2 MHz to 959.8 MHz, covering all 124 contiguous channels of 200 kHz each. The purpose of this filter is to reject all frequencies outside the desired region. LNA 176 amplifies the very weak signal on connection 174 to a level at which downconverter 178 can translate the signal from the transmitted frequency back to a baseband frequency. Alternatively, the functionality of LNA 176 and downconverter 178 can be accomplished using other elements, such as, for example but not limited to, a low-noise block downconverter (LNB).

Downconverter 178 receives a frequency reference signal, also called a "local oscillator" signal, or "LO," from synthesizer 148, via connection 180. The LO signal instructs the downconverter 178 as to the proper frequency to which to downconvert the signal received from LNA 176 via connection 182. The downconverted frequency is called the intermediate frequency or IF. Downconverter 178 sends the downconverted signal via connection 184 to channel filter 186, also called the "IF filter." Channel filter 186 filters the downconverted signal and supplies it via connection 188 to amplifier 190. The channel filter 186 selects the one desired channel and rejects all others. Using the GSM system as an example, only one of the 124 contiguous channels is actually to be received. After all channels are passed by receive filter 168 and downconverted in frequency by downconverter 178, only the one desired channel will appear precisely at the center frequency of channel filter 186. The synthesizer 148, by controlling the local oscillator frequency supplied on connection 180 to downconverter 178, determines the selected channel. Amplifier 190 amplifies the received signal and supplies the amplified signal via connection 192 to demodulator 194. Demodulator 194 recovers the transmitted analog information and supplies a signal representing this information via connection 196 to ADC 134. ADC 134 converts these analog signals to a digital signal at baseband frequency and transfers the signal via bus 128 to DSP 126 for further processing.

Figure 2:
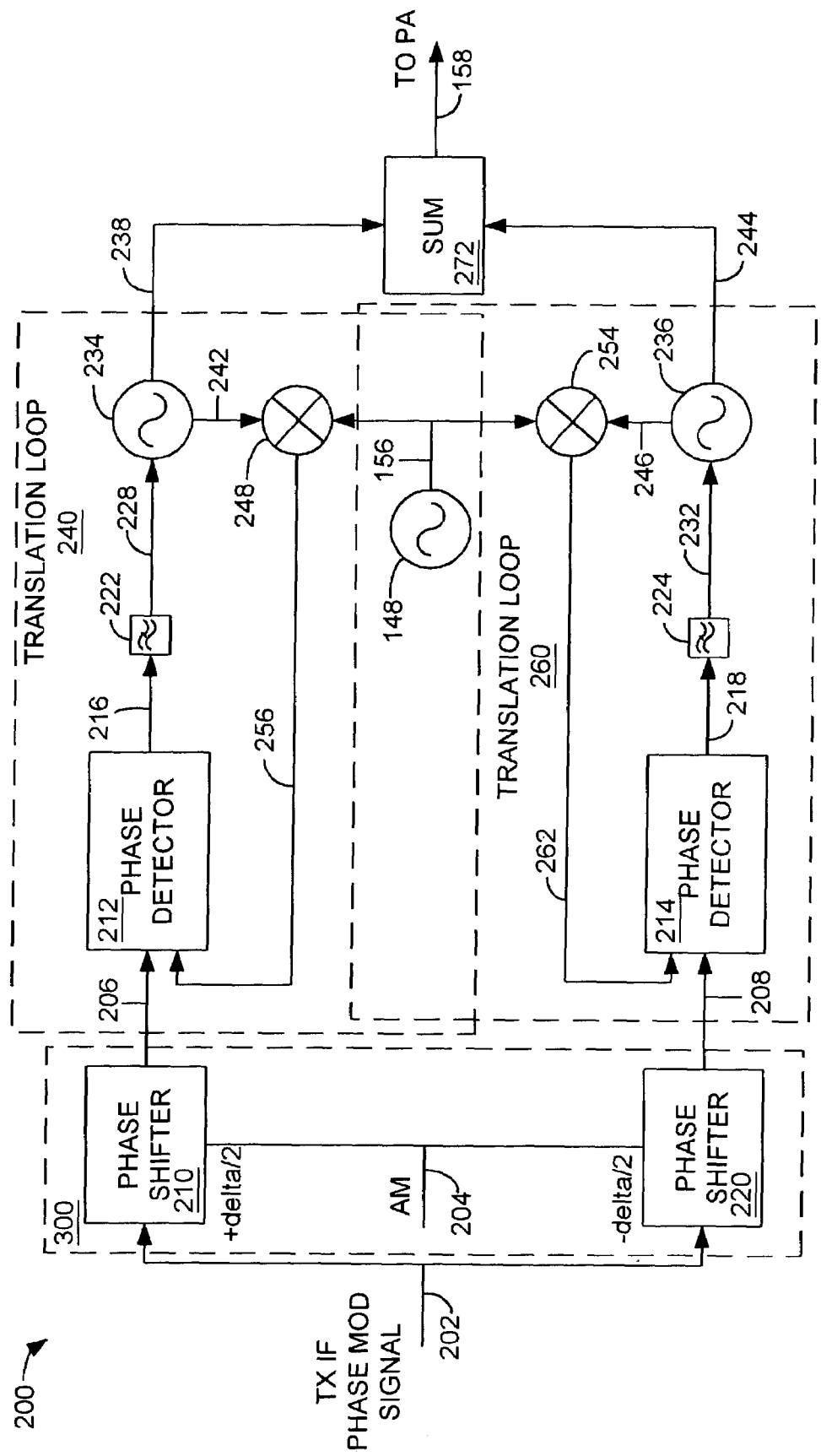
FIG. 2 is a block diagram illustrating the mirror translation loop of FIG. 1.

FIG. 2 is a block diagram illustrating the mirror translation loop 200 of FIG. 1. The mirror translation loop 200 includes a phase altering device 300, which includes a phase shifter 210 and a phase shifter 220. The phase altering device 300 can be, for example but not limited to, an analog phase shifter, a direct digital synthesizer (DDS) or an in-phase (I) quadrature (Q) (I/Q) modulator. As will be described below with respect to FIG. 3, the phase shifter 210 and the phase shifter 220 can be implemented as an IQ modulator 300.

A phase-modulated signal component, which, for example, can be supplied either from the baseband subsystem 110 or as an intermediate frequency (IF) transmit signal is supplied on connection 202. The phase-modulated signal component on connection 202 is supplied to both the phase shifter 210 and phase shifter 220. An amplitude-modulated signal component, that can similarly be supplied, for example, either from the baseband subsystem 110 or at an IF transmit frequency, is supplied on connection 204 to both the phase shifter 210 and the phase shifter 220.

The phase shifter 210 and the phase shifter 220 receive the amplitude modulation information on connection 204 and alter the phase of the phase-modulated signal component on connection 202 by an amount related to the magnitude (i.e., the amplitude) of the amplitude modulation, according to the AM signal on connection 204. The phase shifters 210 and 220 each apply a phase delta (i.e., a phase change), preferably of the same amount but with opposite sign, to the phase-modulated signal component on connection 202. For example, the phase shifter 210 applies a positive 60° phase shift to the phase-modulated signal component on connection 202, while the phase shifter 220 applies a negative 60° phase shift to the phase-modulated signal component on connection 202. While the phase shifts could be as much as 90°, in practice they are unlikely to go this far. Accordingly, 60° is used in the example. The output of the phase shifter 210 includes a vector representing the phase-modulated signal component on connection 202 and the amplitude-modulated signal component on connection 204. Similarly, the output of the phase shifter 220 includes a vector representing the phase-modulated signal component on connection 202 and the amplitude-modulated signal component on connection 204.

The output of the phase shifter 210 on connection 206 and the output of the phase shifter 220 on connection 208 are supplied to a pair of translation loops 240 and 260. The output of the phase shifter 210 on connection 206 includes a vector representing both a phase-modulated signal component and an amplitude-modulated signal component. Similarly, the output of phase shifter 220 on connection 208 includes a vector representing the phase-modulated signal component and the amplitude-modulated signal component. However, at connections 206 and 208 there is no actual amplitude modulation present. The amplitude modulation information is contained in the mathematical vector sum of the vectors of the signals on connections 206 and 208, and, as will be described below, the physical amplitude modulation is not generated until these two signals are summed. The vector on connection 206 includes a phase shift that is opposite to the included phase shift of the vector on connection 208. The phase shifter 210 and the phase shifter 220 alter the phase of the phase-modulated signal component on connection 202 by an amount related to the amplitude (i.e., the magnitude) of the amplitude-modulated signal component on connection 204.

Alternatively, in a transmit format that uses only, for example, phase modulation, the phase-modulated signal on connection 202 would be passed directly through the phase shifter 210 on connection 206 and through the phase shifter 220 to connection 208. That is, the amplitude modulation information on connection 204 would amount to only a constant, so that no time-changing phase shifts would be performed by phase shifters 210 and 220.

As another alternative example, if the transmit signal includes only an amplitude-modulated component, then the phase-modulated signal component is replaced by a continuous wave (CW) signal. The amplitude modulation is applied to the phase shifters as described above. The mirror translation loops (to be described below) upconvert the signal and each provide a vector. The two vectors are summed together to provide a signal to a power amplifier. The phase of the two vectors is such that the phase of their vector sum is constant, but the amplitude of their vector sum represents the desired amplitude modulation.

The translation loop 240 and the translation loop 260 comprise a pair of translation loops that are arranged in a "mirror translation loop architecture." The signal on connection 206 is supplied to phase detector 212. Phase detector 212 compares the phase of the signals supplied on connections 206 and 256 and supplies a signal representing the phase difference on connection 216. The output of the phase detector 212 is sent via connection 216 to low-pass filter 222. The low-pass filter 222 filters the signal on connection 216 and passes a signal at the appropriate frequency on connection 228 to transmit (TX) voltage controlled oscillator (VCO) 234. The TX VCO 234 supplies a low noise, clean modulated signal (i.e., a signal with a very low out-of-band noise) via connection 238 to adder 272. By using an oscillator 234 to supply a low noise modulated signal, the need for filtering before and after the power amplifier (160 of FIG. 1) may be reduced or eliminated.

A synthesizer 148 supplies a local oscillator signal via connection 156 to the mixer 248. The mixer 248 combines the portion of the output of the TX VCO 234 on connection 242 with the output of the synthesizer 148 (i.e., the local oscillator signal) supplied via connection 156. The output of the mixer 248 is then communicated via connection 256 to the phase detector 212. The phase detector 212 detects any phase difference between the phase shifted IF modulated signal on connection 206 and the output of the mixer 248 on connection 256, thus ensuring that the frequency of the output of the phase detector 212 on connection 216 is defined by the frequency of the local oscillator signal supplied by the synthesizer 148. In this manner, the synthesizer 148, the mixer 248 and the connection 256 form a translation loop including a phase locked loop (PLL), which is used to determine the transmit frequency to which the signal on connection 206 is upconverted. For example, the synthesizer 148 and the mixer 248 ensure that the frequency of the signal output from the TX VCO 234 on connection 238 tracks that of the local oscillator signal supplied by the synthesizer 148.

Similarly, the output of the phase shifter 220 is supplied via connection 208 to the phase detector 214. The phase detector 214 compares the phase of the signals supplied on connections 208 and 262 and supplies a signal representing the phase difference on connection 218. The output of the phase detector 214 is sent via connection 218 to the low-pass filter 224. The low-pass filter 224 filters the signal on connection 218 and passes a signal at the appropriate frequency on connection 232 to TX VCO 236. The TX VCO 236 supplies a low noise, clean modulated signal via connection 244 to the adder 272.

A portion of the output of the TX VCO 236 is sent via connection 246 to the mixer 254. The mixer 254 combines the portion of the output of the TX VCO 236 on connection 246 with the output of the synthesizer 148 supplied via connection 156. The output of the mixer 254 is then communicated via connection 262 to the phase detector 214. The phase detector 214 detects any phase difference between the phase shifted IF modulated signal on connection 208 and the output of the mixer 254 on connection 262, thus ensuring that the frequency of the output of the phase detector 214 on connection 218 is defined by the frequency of the local oscillator signal supplied by the synthesizer 148. In this manner, the synthesizer 148, the mixer 254 and the connection 262 form a translation loop 260 including a phase locked loop (PLL), which is used to determine the transmit frequency to which the signal input on connection 208 is upconverted.

The translation loop 240 and the translation loop 260 each supply a vector on connections 238 and 244, respectively. The vectors supplied on connections 238 and 244 are constant, and essentially equal, in magnitude, but each includes a phase shift having originated at phase shifters 210 and 220, where such phase shifts are equal, or nearly so, in amount but opposite in phase. In practice, a small amount of error in magnitude and amount of phase between the two vectors on connections 238 and 244 could be tolerated, which would result in a small inaccuracy in the modulation at the system output. In accordance with an aspect of the invention, the same phase information is applied to the phase-modulated signal component on connection 202 and supplied to each phase shifter 210 and 220 and to the translation loops 240 and 260. However, in order to facilitate a non-constant envelope modulation format (i.e., one that includes a time-varying amplitude modulation), the amplitude modulation component is supplied on connection 204 to each phase shifter 210 and 220. The phase shifters 210 and 220 oppositely alter the phase of the phase-modulated signal component on connection 202 so that phase-modulated signal components having complementary phase are supplied to the translation loops 240 and 260, respectively. In this manner, the mirror translation loop architecture shown in FIG. 2 can be used to upconvert a transmit signal containing both phase modulation information and amplitude modulation information, while allowing the low noise TX VCOs 234 and 236 to provide a very low noise output.

The output of the TX VCO 234 on connection 238 and the output of the TX VCO 236 on connection 244 are supplied to adder 272. The adder 272 combines the vectors on connections 238 and 244 to provide a combined, upconverted transmit signal on connection 158, which will ultimately be supplied to the power amplifier 160 of FIG. 1.

Figure 3:
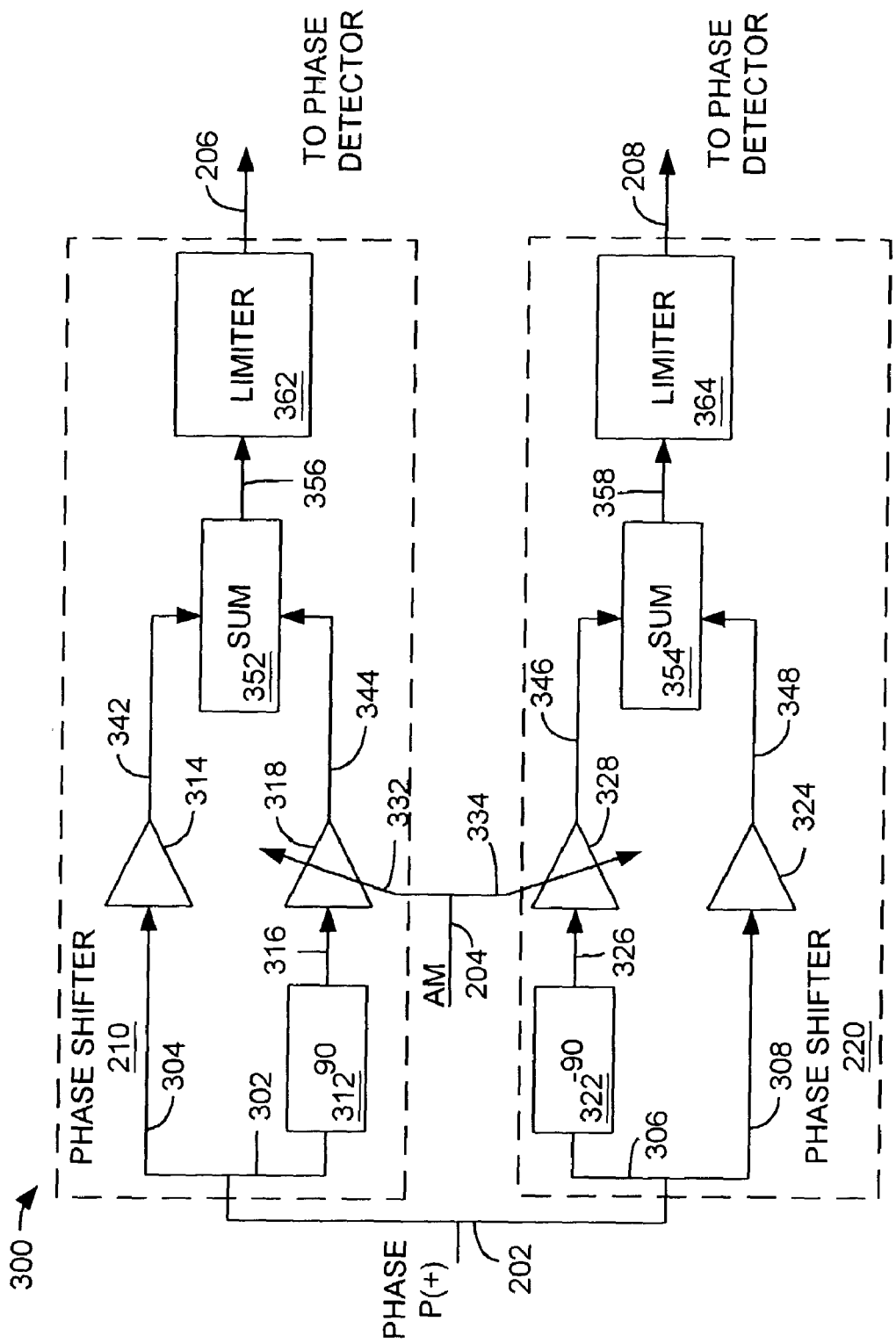
FIG. 3 is a block diagram illustrating the phase shifters of FIG. 2 implemented as an IQ modulator.

FIG. 3 is a block diagram illustrating the phase shifters 210 and 220 of FIG. 2 implemented as an IQ modulator 300. The phase-modulated signal component on connection 202 is supplied to phase shifter 210 on connections 302 and 304, while the phase-modulated signal component on connection 202 is supplied to the phase shifter 220 via connections 306 and 308. The phase-modulated signal component on connection 304 is supplied to IF amplifier 314, the output of which is supplied via connection 342 to adder 352. The IF amplifier preferably operates in the 100 MHz range and amplifies the phase-modulated signal on connection 304.

The phase-modulated signal component on connection 302 is supplied to 90° phase change element 312. The phase change element 312 can be implemented as, for example, a resistive-capacitive (RC) network. The output of the 90° phase change element 312 is supplied via connection 316 to variable amplifier 318. The amplitude modulation information signal on connection 204 is supplied to the control input 332 of the variable amplifier 318. In this manner, the phase-modulated signal component on connection 202 has been shifted in phase by 90° by phase change element 312 and supplied to the variable amplifier 318 via connection 316. The amplitude of the phase-modulated signal component on connection 316 is varied by an amount related to the amplitude of the amplitude-modulated signal component on connection 204 and supplied to the variable amplifier 318 through the control input 332. By supplying the amplitude-modulated signal component to the variable amplifier 318 via the control input 332, the amplitude of the phase-modulated signal component on connection 316 is varied by an amount related to the magnitude (e.g., the amplitude) of the amplitude-modulated signal component on connection 204.

The output of the IF amplifier 314 on connection 342 and the output of the variable amplifier 318 on connection 344 are supplied to the adder 352. The signals are combined in the adder 352 and then supplied via connection 356 to a limiter 362. Since the signal on connection 344 is shifted by 90° relative to the signal on connection 342, an overall phase shift between 0° and 90° is achieved (relative to the input signal on connection 302) when the two signals (on connections 342 and 344) are added together. The phase shifter 210 (and phase shifter 220 to be described below) works by summing a 0° component and a 90° component where the amplitude of the 90° component is varied by amplifier 318 according to the signal on connection 204. If the gain of amplifier 318 tends toward zero, then the phase of the output 206 will be close to 0°. If the gain of amplifier 318 tends toward infinity, then the phase of the output 206 will be close to 90°. So, at amplifier 318, the amplitude information signal 204 first directly affects the amplitude of the signal on connection 316, and only later at the summer 352 does this give a phase. Then, the two phases at 206 and 208 will be combined at the mirror translation loop outputs (FIG. 2) to finally get the desired amplitude modulation.

For example, if the gain of amplifier 318 is set equal to the gain of amplifier 314, then the net phase shift at connection 356 relative to connection 302 is 45°. This phase shift can be made to tend toward 0° by reducing the gain of amplifier 344, or toward 90° by increasing the gain of amplifier 344. The output signal at connection 356 therefore contains the desired phase, but also has its amplitude vary according to the amount of gain set at amplifier 318. At the output of the phase shifter 210, which is connection 206, only the phase modulation is needed, so limiter 362 is placed in the signal path to remove any amplitude modulation. The output of the limiter 362 is supplied via connection 206 to the phase detector 212 (FIG. 2). If phase detector 212 provides a limiting function, or if it can completely reject any AM on its input, then the limiter 362 is not used.

Similarly, the phase-modulated signal component on connection 202 is supplied to a −90° phase change element 322 and via connection 308 to an IF amplifier 324. The −90° phase change element 322 is similar to the 90° phase change element 312, but has components selected to produce a −90° phase shift instead of a 90° phase shift. Similarly, the IF amplifier 324 is similar to the IF amplifier 314. The −90° phase change element 322 alters the phase of the signal on connection 306 by −90° and supplies this phase altered signal on connection 326 to variable amplifier 328. The phase-modulated signal component on connection 202 is supplied via connection 308 to the IF amplifier 324 which provides an amplified version of the signal on connection 202 via connection 348 to adder 354.

The amplitude-modulated signal component on connection 204 is supplied to the control input 334 of the variable amplifier 328. As described above, the amplitude of the signal on connection 326 is altered by an amount related to the magnitude (e.g., the amplitude) of the signal on connection 204. The output of the variable amplifier is supplied via connection 346 to adder 354. The adder 354 combines the output of the variable amplifier 328 on connection 346 and the output of the IF amplifier 324 on connection 348 and supplies a combined signal on connection 358. The signal on connection 358, which includes a phase-modulated signal component that is altered in amplitude by an amount related to the magnitude of the amplitude-modulated signal component on connection 204 is supplied to the limiter 364. The output of the limiter 364 is supplied via connection 208 to the phase detector 214 (FIG. 2). An alternative implementation of the phase shifter 300 is illustrated below in FIG. 5.

Figure 4:
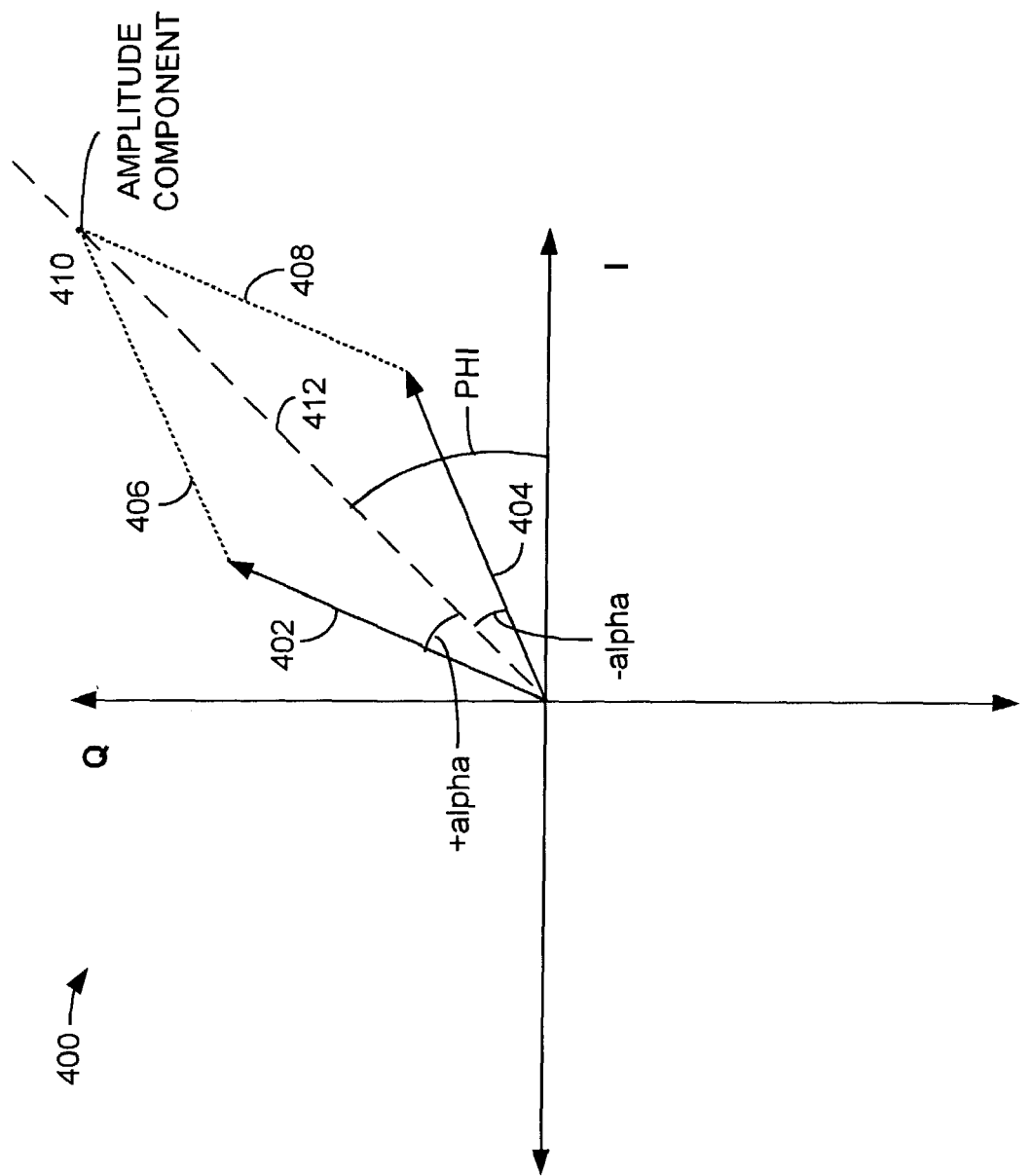
FIG. 4 is a graphical representation of the output of the translation loop of FIG. 2.

FIG. 4 is a graphical representation 400 of the output of the translation loop 240 and a translation loop 260 of FIG. 2. The horizontal axis of the graph represents the in-phase (I) component of the transmit signal and the vertical axis of the graph represents the quadrature (Q) component of the transmit signal. The output of each translation loop 240 and 260 is a constant amplitude vector, the phase of which is altered based upon the amplitude of the amplitude-modulated signal. For example, the vector 402 represents the output from the translation loop 240 on connection 238 and the vector 404 represents the output of the translation loop 260 on connection 244. These vectors 402 and 404 are combined in the adder 272 (FIG. 2) whereby the average direction in which the two vectors point (i.e., the average phase of the two vectors) is the phase of the combined upconverted signal, and the vector sum of the two vectors 402 and 404 determines the amplitude of the combined upconverted signal.

This is illustrated in FIG. 4 using dotted lines 406 and 408, which converge at point 410. The point 410 represents the amplitude component of the two vectors 402 and 404. The average phase of the two signals, illustrated by dotted line (vector) 412, represents the phase Φ, which is the average direction in which the two vectors point.

In this manner, both phase and amplitude information can be upconverted by the mirror translation loop architecture of FIG. 2.

The phase shifts that are applied by the phase shifters 210 and 220 (FIG. 2) are the angles +α (alpha) and −α (alpha), respectively, as shown in FIG. 4. In the particular case where the phase shifters are implemented as shown in FIG. 2, the AM information signal 204 is:

AM information signal 204=tan($a$ cos($R$/2)), where R is the length of the desired amplitude vector 412, and amplifiers 324 and 314 are fixed at unity gain. This equation for the AM information signal 204 may be, for example, computed by digital signal processor 126 (FIG. 1) and converted to analog format by a DAC (other than the DACs shown in FIG. 1)), which would supply the signal to the upconverter 200 on connection 204. The DSP may use any computation method including lookup tables or numerical approximations for the trigonometric functions. Alternatively, the AM information signal 204 may be extracted by analog signal processing from the transmit baseband signals on connection 140 (FIG. 1) or the transmit IF signal on connection 152.

A single transmit architecture can be used to upconvert a transmit signal having only a phase-modulated component, only an amplitude-modulated component, and can also be used to upconvert a transmit signal having a phase-modulated component and an amplitude-modulated component. Further, this can be accomplished using a translation loop architecture which can provide a very low noise output signal. In this manner, the mirror translation loop architecture shown in FIG. 2, can be used to efficiently amplify a variety of transmit signals including constant envelope modulation formats and non-constant envelope modulation formats.

Figure 5:
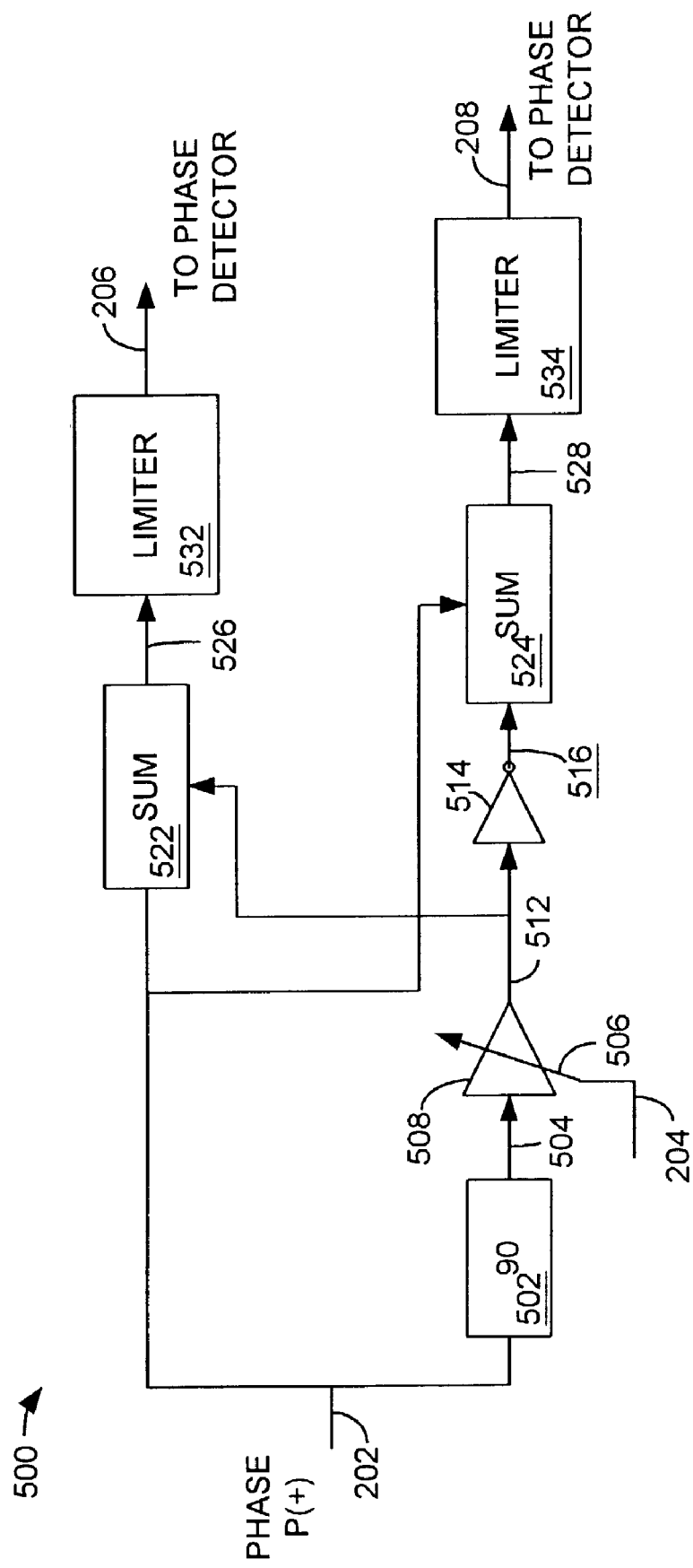
FIG. 5 is a block diagram illustrating an alternative embodiment of the phase shifters of FIG. 3.

FIG. 5 is a schematic diagram illustrating an alternative implementation of the phase shifter of FIG. 3. The implementation shown in FIG. 5 generates the phase shifted signals on connections 206 and 208 by using fewer components than shown in FIG. 3, rather than providing the complete separate phase shifters 210 and 220. In FIG. 5 the intermediate frequency (IF) transmit signal is supplied on connection 202. However, only one 90° shifter 502 is used to shift the signal on connection 202 by 90°. The 90° phase shifted signal on connection 504 is then supplied to variable amplifier 508, which functions similar to amplifier 318 of FIG. 3. The amplifier 508 receives the amplitude, modulation information signal on connection 204, which is supplied to the control input 506 of the variable amplifier 508. The output of the variable amplifier 508 is supplied via connection 512 to inverter 514.

The −90° phase shift is derived by the inverter 514. Alternatively, the function of the variable amplifier 508 and the function of the inverter 514 can be performed using an inverting amplifier. The output of the variable amplifier on connection 512 is summed in summing element 522 with the intermediate frequency (IF) transmit signal on connection 202. The output of the summing element 522 is supplied on connection 526 to the limiter 532. The output of the inverter 514 on connection 516 is summed in summing element 524 with the intermediate frequency (IF) transmit signal on connection 202. The output of the summing element 524 is supplied on connection 528 to the limiter 534. The limiters 532 and 534 function in similar manner to the limiters 362 and 364 of FIG. 3.

By having only one such phase shifted path, only one AM-injecting amplifier (variable amplifier 508) is used. The AM information signal is the same as previously described. One of ordinary skill in the art will recognize that the implementation of FIG. 5 performs the same function as that of FIG. 3.

While various embodiments of the invention have been described, it will be apparent to those of ordinary skill in the art that many more embodiments and implementations are possible that are within the scope of this invention. Accordingly, the invention is not to be restricted except in light of the attached claims and their equivalents.

What is claimed is:

1. A method for signal up-conversion, comprising:
providing a first modulated signal and a second modulated signal to a first phase shifter;
providing the first modulated signal and the second modulated signal to a second phase shifter;
altering the phase of the first modulated signal by an amount related to the magnitude of the second modulated signal so that the first phase shifter and the second phase shifter each provide a phase-altered version of the first modulated signal, wherein the phase-altered version of the first modulated signal supplied by the first phase shifter and the second phase shifter are altered by the same amount of phase, but each with opposite sign;
supplying the output of the first phase shifter and the second phase shifter to a pair of translation loops;
upconverting the phase-altered version of the first modulated signal in a first of the pair of translation loops;
upconverting the phase-altered version of the first modulated signal in a second of the pair of translation loops; and
combining the outputs of the first and second translation loops where the combined signal represents the first and second modulated signals.

2. The method of claim 1, wherein the first modulated signal is phase-modulated and the second modulated signal is amplitude-modulated.

3. The method of claim 1, wherein the first phase shifter and the second phase shifter are implemented as an in-phase (I) and quadrature (Q) modulator.

4. The method of claim 1, wherein the outputs of the first and second translation loops are constant amplitude vectors and wherein the combining step combines the constant amplitude vectors to generate the combined signal having a phase defined by the phase of the constant amplitude vectors and an amplitude defined by the combined amplitude of the constant amplitude vectors.

5. The method of claim 1, wherein the first and second modulated signals are intermediate frequency signals.

6. The method of claim 1, wherein the first and second modulated signals are baseband signals.

7. A translation loop upconverter, comprising:
a first phase shifter configured to receive first and second modulated signals;
a second phase shifter configured to receive the first and second modulated signals, the first and second phase shifters configured to amplify the first modulated signal and configured to alter the phase of the first modulated signal by an amount related to the magnitude of the second modulated signal, where the output of the first and second phase shifters comprises a phase-altered version of the first modulated signal, and wherein the phase-altered version of the first modulated signal supplied by the first phase shifter and the second phase shifter are opposite in phase;
a first translation loop having a first phase locked loop and configured to receive the output of the first phase shifter, and supply an output signal at a particular phase and amplitude;
a second translation loop having a second phase locked loop and configured to receive the output of the second phase shifter, and supply an output signal at a particular phase and amplitude; and
an adder configured to add the outputs of the first translation loop and the second translation loop, where the output of the adder is a combined signal representing the phase and amplitude of the first and second modulated signals.

8. The system of claim 7, wherein the first phase shifter and the second phase shifter further comprise an in-phase (I) and quadrature (Q) modulator.

9. The system of claim 7, wherein the first and second modulated signals are intermediate frequency signals.

10. The system of claim 7, wherein the first and second modulated signals are baseband signals.

11. The system of claim 7, wherein the first modulated signal is a phase-modulated signal.

12. The system of claim 7, wherein the second modulated signal is an amplitude-modulated signal.

13. The system of claim 7, wherein the outputs of the first and second translation loops are constant amplitude vectors and wherein the adder combines the constant amplitude vectors to generate the combined signal having a phase defined by the phase of the constant amplitude vectors and an amplitude defined by the combined amplitude of the constant amplitude vectors.

14. A method for transmit signal up conversion in a portable telecommunications device, comprising:
providing a first combined signal and a second combined signal to respective first and second translation loops, the first combined signal including a first modulated signal that is altered in phase by an amount related to the magnitude of a second modulated signal, the second combined signal including the first modulated signal that is altered in phase by an amount related to the magnitude of a second modulated signal, the second combined signal being altered by the same amount of phase as the first combined signal, but opposite in sign from the first combined signal;
upconverting the first combined signal and the second combined signal; and
adding the upconverted first and second combined signals resulting in a third combined upconverted signal that includes the information in the first modulated signal and the second modulated signal.

15. The method of claim 14, where the first modulated signal is phase-modulated and the second modulated signal is amplitude-modulated.

16. The method of claim 15, further comprising:
supplying the phase-modulated signal and an amplitude-modulated signal to a first phase shifter; and
supplying the phase-modulated signal and the amplitude-modulated signal to a second phase shifter.

17. The method of claim 16, wherein the first phase shifter and the second phase shifter further comprise an in-phase (I) and quadrature (Q) modulator.

18. The method of claim 16, wherein the first modulated signal and the second modulated signal are intermediate frequency signals.

19. The method of claim 16, wherein the first modulated signal and the second modulated signal are baseband signals.

20. The method of claim 14, wherein the upconverted first and second combined signals are Constant amplitude vectors and wherein the adding step combines the constant amplitude vectors to generate the third combined upconverted signal having a phase defined by the phase of the constant amplitude vectors and an amplitude defined by the combined amplitude of the constant amplitude vectors.

21. A system for transmit signal up conversion in a portable telecommunications device, comprising:
a pair of translation loops each translation loop configured to receive a combined signal including a first modulated signal that is altered in phase by an amount related to the magnitude of a second modulated signal, where the first modulated signal is phase-modulated and the second modulated signal is amplitude-modulated;
where each of the translation loops upconvert the combined signal;
an adder configured to add the output of each of the translation loops resulting in a combined upconverted signal;
a first phase shifter configured to receive the phase-modulated signal and the amplitude-modulated signal, and supply the phase-modulated signal altered in phase by an amount related to the magnitude of the second modulated signal to a first of the translation loops; and
a second phase shifter configured to receive the phase-modulated signal and the amplitude-modulated signal, and supply the phase-modulated signal altered in phase by an amount related to the magnitude of the second modulated signal to a second of the translation loops, where the first phase shifter and the second phase shifter alter the phase-modulated signal by the same amount but with opposite sign.

22. The system of claim 21, wherein the first phase shifter and the second phase shifter further comprise an in-phase (I) and quadrature (Q) modulator.

23. The system of claim 21, wherein the outputs of each of the translation loops are constant amplitude vectors and wherein the adder combines the constant amplitude vectors to generate the combined upconverted signal having a phase defined by the phase of the constant amplitude vectors and an amplitude defined by the combined amplitude of the constant amplitude vectors.

24. A system for signal up-conversion, comprising:
- means for providing a first modulated signal and a second modulated signal to a first phase shifter;
- means for providing the first modulated signal and the second modulated signal to a second phase shifter;
- means for altering the phase of the first modulated signal by an amount related to the magnitude of the second modulated signal so that the first phase shifter and the second phase shifter each provide a phase-altered version of the first modulated signal, wherein the phase-altered version of the first modulated signal supplied by the first phase shifter and the second phase shifter are altered by the same amount of phase, but each with opposite sign;
- means for supplying the outputs of the first phase shifter and the second phase shifter to a pair of translation loops;
- means for upconverting the phase-altered version of the first modulated signal in a first of the pair of translation loops;
- means for upconverting the phase-altered version of the first modulated signal in a second of the pair of translation loops;
- means for combining the outputs of the first and second translation loops where the combined signal represents the first and second modulated signals.

25. A system for transmit signal up conversion in a portable telecommunications device, comprising:
- a pair of translation loops, each translation loop configured to receive one of two complementary phase-modulated signals, where a first modulated signal is phase-modulated and a second modulated signal is amplitude-modulated;
- where each of the translation loops upconverts a selected one of the two complementary phase-modulated signals;
- an adder configured to add the outputs of each of the translation loops resulting in a combined upconverted signal;
- a first phase shifter configured to receive the phase-modulated signal and the amplitude-modulated signal, and supply the phase-modulated signal altered in phase by an amount related to the magnitude of the second modulated signal to a first of the translation loops; and
- a second phase shifter configured to receive the phase-modulated signal and the amplitude-modulated signal, and supply the phase-modulated signal altered in phase by an amount related to the magnitude of the second modulated signal to a second of the translation loops, where the first phase shifter and the second phase shifter alter the phase-modulated signal by the same amount, but with opposite sign.

* * * * *